United States Patent [19]
Wakayama et al.

[11] Patent Number: 5,736,756
[45] Date of Patent: Apr. 7, 1998

[54] SOLID-STATE IMAGE SENSING DEVICE WITH LGHT SHIELDING FILM

[75] Inventors: Toshiaki Wakayama; Atsushi Asai, both of Kanagawa, Japan

[73] Assignee: Sony Corporation, Tokyo, Japan

[21] Appl. No.: 534,248

[22] Filed: Sep. 26, 1995

[30] Foreign Application Priority Data

Sep. 29, 1994 [JP] Japan .................... 6-234816

[51] Int. Cl.⁶ .................... H01L 27/148; H01L 29/768; H01L 31/0232
[52] U.S. Cl. .................... 257/223; 257/233; 257/435
[58] Field of Search .................... 257/222, 223, 257/229, 232, 233, 435

[56] References Cited

U.S. PATENT DOCUMENTS

| | | | |
|---|---|---|---|
| 5,045,906 | 9/1991 | Nagaya | 257/435 |
| 5,463,232 | 10/1995 | Yamashita et al. | 257/435 |

FOREIGN PATENT DOCUMENTS 7-153932  6/1995  Japan .

*Primary Examiner*—Gene M. Munson
*Attorney, Agent, or Firm*—Hill, Steadman & Simpson

[57] ABSTRACT

A solid-state image sensing device including a light shielding film of aluminum or the like formed to make contact with a silicon substrate over a sensor region so that no insulating film is present between the substrate and the light shielding film in the periphery of an opening of the sensor region. The solid-state image sensing device further includes a potential applying device for applying a predetermined potential to the light shielding film. Accordingly, the solid-state image sensing device can reduce the smear due to the leakage of incident light through between the substrate and the light shielding film in the periphery of the opening of the sensor region and improve the photodetecting characteristics of the sensor region.

8 Claims, 9 Drawing Sheets

SOLID-STATE IMAGE SENSING DEVICE WITH LGHT SHIELDING FILM

BACKGROUND OF THE INVENTION

1. Field of the Invention

The present invention relates to a solid-state image sensing device, and more particularly to a solid-state image sensing device to be preferably used as a CCD area sensor having a two-dimensional arrangement of sensor regions for performing photo-electric conversion or as a CCD linear sensor having a one-dimensional arrangement of the sensor regions.

2. Description of Related Art

FIG. 10 schematically shows the configuration of an interline transfer type of CCD area sensor as an example of a solid-state image sensing device. Referring to FIG. 10, reference numeral 54 generally designates an image sensing section composed of a plurality of sensor regions 51 arranged two-dimensionally, or in a horizontal direction and a vertical direction, for performing photo-electric conversion of incident light to obtain signal charges and accumulate them, and a plurality of vertical transfer registers 53 arranged along the vertical arrays of the sensor regions 51, for vertically transferring the signal charges read out from the sensor regions 51 through read-out gate regions 52.

In the image sensing section 54, each sensor region 51 is constructed of a photodiode, for example, and each vertical transfer register 53 is constructed of a CCD. The signal charges read out to the vertical transfer registers 53 are sequentially transferred to a horizontal transfer register 55 every time one line is scanned. The horizontal transfer register 55 is constructed of a CCD to sequentially transfer the signal charges corresponding to one scanning line in the horizontal direction. A charge detecting section 56 is provided at a final end of the horizontal transfer register 55 to detect the signal charges transferred by the horizontal transfer register 55 and convert them into a signal voltage. The charge detecting section 56 is constructed of a floating diffusion amplifier, for example.

FIG. 11 shows a cross section taken along the line X—X in FIG. 10, and FIG. 12 shows a cross section taken along the line Y—Y in FIG. 10. As apparent from FIGS. 11 and 12, a channel stop region (CS) 57 of $P^+$-type impurity as an isolation region is formed around the sensor region 51 except its one side adjacent to the read-out gate region (ROG) 52. Further, a transfer electrode 60 is provided over the read-out gate region 52, the vertical transfer register (VCCD) 53, and the channel stop region 57 formed in the surface of an N-type silicon substrate 58 through an insulating film 59 of silicon oxide, $SiO_2$, for example.

In the vertical transfer register 53, the transfer electrode 60 extending in a charge transfer direction (Y-direction) has a two-layer structure formed of polysilicon. As shown in FIG. 12, wiring patterns 61a and 61b for connecting the lower layers of the adjacent vertical transfer registers 53 and the upper layers of the adjacent vertical transfer registers 53, respectively, are formed over the channel stop region 57. A light shielding film 62 of aluminum (Al) or the like is formed outside the transfer electrode 60 and on a part of the sensor region 51 except its opening 51a through the insulating film 59, so as to cut off the incidence of external light upon the vertical transfer register 53.

The CCD area sensor configured above has a light shielding structure such that the light shielding film 62 is provided over the substrate 58 through the insulating film 59.

Accordingly, especially when a large quantity of light is incident on the sensor region 51, or light is obliquely incident on the sensor region 51, a component of the light reflected on the surface of the substrate 58 is then incident on a lower end surface of the light shielding film 62 in the periphery of the opening 51a of the sensor region 51. This reflected light component is repeatedly refracted in the insulating film 59 between the substrate 58 and the light shielding film 62 to finally enter a signal charge transfer layer 63 constituting the vertical transfer register 53. That is, a part of the incident light leaks through between the substrate 58 and the light shielding film 62 in the periphery of the opening 51a of the sensor region 51 into the signal charge transfer layer 63. The light having leaked into the signal charge transfer layer 63 generates photoelectrons, which causes the occurrence Of smear, resulting in appearance of vertical streaks on a reproduction screen.

An example of a CCD area sensor intended to suppress the occurrence of smear is disclosed in Japanese Patent Laid-open No. 63-142859. This conventional CCD area sensor is configured so that at least the surface of a sensor region, the surface of an isolation region between a sensor region and a transfer region, or the surface of an isolation region between sensor regions is partially in contact with a light shielding film. Thus, the contact between the light shielding film and the substrate is made to thereby prevent the leakage of light through between the light shielding film and the substrate into the signal charge transfer layer of the vertical transfer register, thus suppressing the occurrence of smear.

In the CCD area sensor having a HAD (Hole Accumulation Diode) structure such that the sensor region 51 is composed of a signal charge accumulation layer 64 and a hole accumulation layer 65 formed on the layer 64 as shown in FIG. 11, the potential of an interface in the sensor region 51 (which will be hereinafter referred to as a sensor interface) is suppressed to 0 V or less by the potential of the channel stop region 57. However, there is a potential difference between a peripheral portion and an inside portion of the sensor region 51 due to a voltage drop or the like. Accordingly, the potential of the sensor interface especially in the inside portion of the sensor region 51 becomes positive, so that the sensor interface cannot be filled with holes. As a result, electrons generated at the interface stay in the signal charge transfer layer 64, causing an increase in dark current especially inside the sensor region 51 or generation of a false signal, which appears as a white-spot defect on the reproduction screen. In addition, the conventional sensor region 51 is limited in its structure to result in limited improvement in photodetecting characteristics such as sensitivity and S/N.

SUMMARY OF THE INVENTION

It is accordingly an object of the present invention to provide a solid-state image sensing device which can reduce the smear due to the leakage of incident light through between a substrate and a light shielding film in the periphery of an opening of a sensor region, and can also reduce a dark current.

It is another object of the present invention to provide a solid-state image sensing device which can improve the photodetecting characteristics of the sensor region.

According to the present invention, there is provided a solid-state image sensing device comprising a sensor region composed of a plurality of photosensors; a charge transfer region for transferring a signal charge read out from the sensor region through a read-out gate region; an isolation region provided opposite to at least the read-out gate region with respect to the sensor region; a substrate in which the sensor region, the charge transfer region, and the isolation region are formed; a transfer electrode formed over at least the charge transfer region and the read-out gate region through an insulating film; a light shielding film provided outside the transfer electrode and on a part of the sensor region except an opening thereof to prevent incidence of external light upon the charge transfer region, the light shielding film being in contact with the substrate over the sensor region; and means for applying a predetermined potential to the light shielding film.

In the solid-state image sensing device according to the present invention, the light shielding film is in contact with the substrate over the sensor region. Accordingly, even when light is obliquely incident on the sensor region, a part of the incident light is prevented from leaking through between the light shielding film and the substrate into the charge transfer region. As a result, the smear due to the leakage of incident light through between the substrate and the light shielding film in the periphery of the opening of the sensor region can be reduced. Furthermore, the potential of the sensor interface can be set equal to or lower than the quasi-Fermi level of the surface layer of the sensor region without any influence of an environment surrounding the sensor region by applying a predetermined potential to the light shielding film formed to make contact with the substrate. As a result, a dark current can be reduced, and the generation of a false signal can be suppressed to thereby reduce a white-spot defect appearing on a reproduction screen. Further, minority carriers generated by photoelectric conversion are allowed to escape into the light shielding film by applying a potential lower than the surface potential of the sensor region to the light shielding film upon detection of light by the sensor region. Accordingly, the probability of recombination of electrons and holes can be reduced to thereby improve the photodetecting characteristics of the sensor region.

Other objects and features of the invention will be more fully understood from the following detailed description and appended claims when taken with the accompanying drawings.

DETAILED DESCRIPTION OF THE PREFERRED EMBODIMENTS

Some preferred embodiments of the present invention applied to a CCD area sensor, for example, will now be described with reference to the drawings. It is to be noted that the application of the present invention is not limited to such a CCD area sensor having a two-dimensional arrangement of sensor regions, but the present invention may be similarly applied also to a CCD linear sensor having a one-dimensional arrangement of sensor regions.

Figure 1:
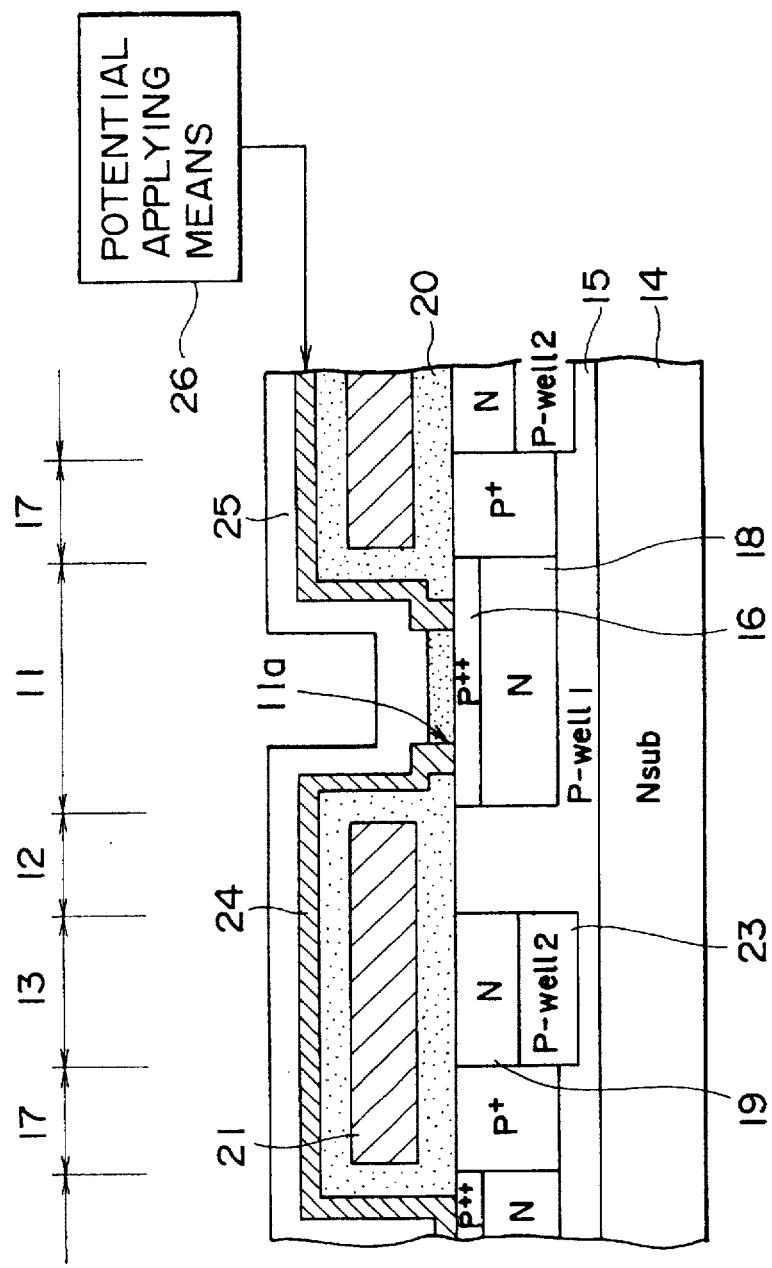
FIG. 1 is a sectional view of a sensor region and its peripheral region, showing a preferred embodiment of the present invention applied to a CCD area sensor, corresponding to a cross section taken along the line X—X in FIG. 10.
Figure 10:
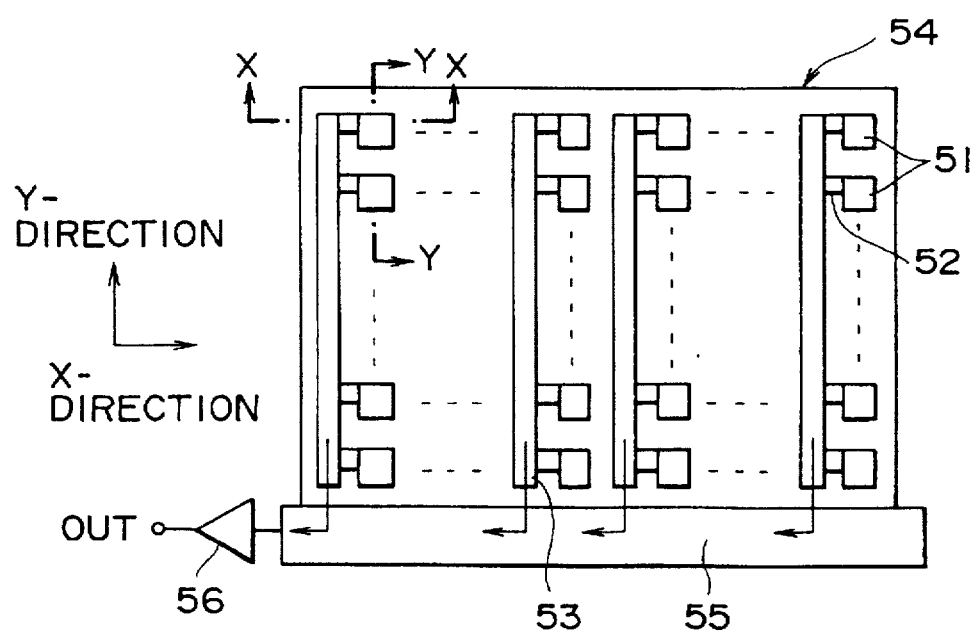
FIG. 10 is a schematic plan view of an interline transfer type of CCD area sensor.
Figure 11:
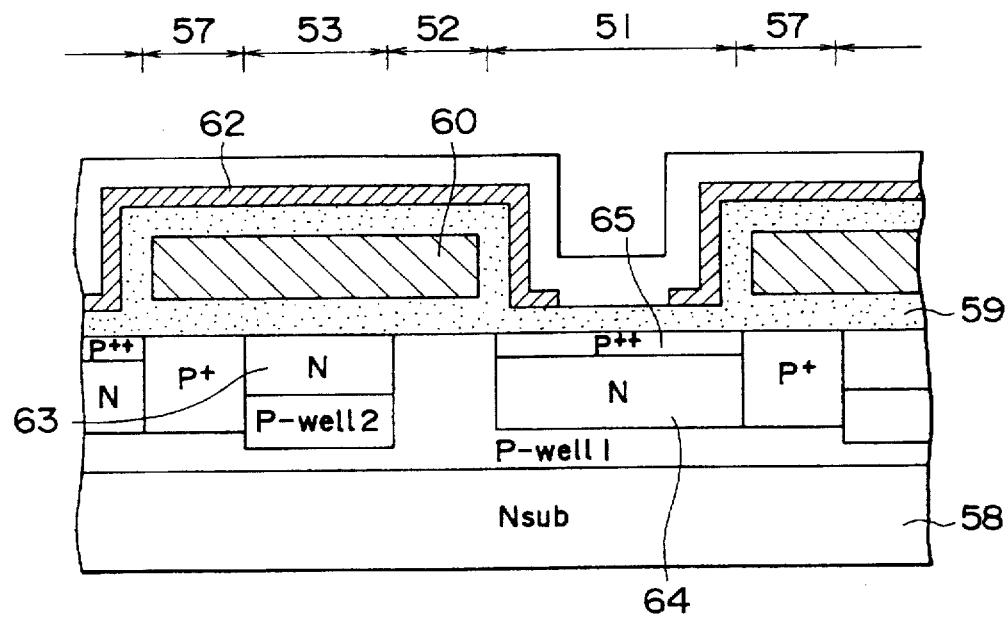
FIG. 11 is a cross section taken along the line X—X in FIG. 10.

FIG. 1 is a sectional view of the structure showing a preferred embodiment of the present invention, which corresponds to the cross section taken along the line X—X shown in FIG. 10. Referring to FIG. 1, reference numeral 11 denotes a sensor region having a HAD structure composed of a shallow hole accumulation layer (the second conducting type of semiconductor layer) 16 of $P^{++}$-type impurity, formed in a surface region of a first P-well (P-well 1) 15 on an N-type silicon substrate 14, and a signal charge accumulation layer (the first conducting type of semiconductor layer) 18 of N-type impurity, formed beneath the hole accumulation layer 16. A channel stop region 17 of $P^+$-type impurity is formed as an isolation region adjacent to the hole accumulation layer 16 and the signal charge accumulation layer 18.

Reference numeral 13 denotes a vertical transfer register (VCCD) composed of a signal charge transfer layer 19 of N-type impurity, formed in the surface region of the first P-well 15 with a read-out gate region (ROG) 12 being interposed between the sensor region 11 and the vertical transfer register 13, and a transfer electrode 21 of polysilicon, formed over the read-out gate region 12, the signal charge transfer layer 19, and the channel stop region 17 through an insulating film 20 of silicon oxide, $SiO_2$. In the vertical transfer register 13, a second P-well (P-well 2) 23 is formed beneath the signal charge transfer layer 19 to suppress the occurrence of smear.

A light shielding film 24 of aluminum (Al) or the like is formed outside the transfer electrode 21 and on a part of the sensor region 11 except an opening 11a thereof to cut off the incidence of external light upon the signal charge transfer layer 19 of the vertical transfer register 13. Outside the transfer electrode 21, the light shielding film 24 is provided through the insulating film 20. On the other hand, in the periphery of the opening 11a of the sensor region 11, the light shielding film 24 is provided directly on the substrate 14 without the insulating film 20 to make contact with the substrate 14. A predetermined potential is applied to the light shielding film 24 by potential applying means 26. The surfaces of the light shielding film 24 and the sensor regions 11 are covered with a transparent thin protective film 25.

Figure 2A:
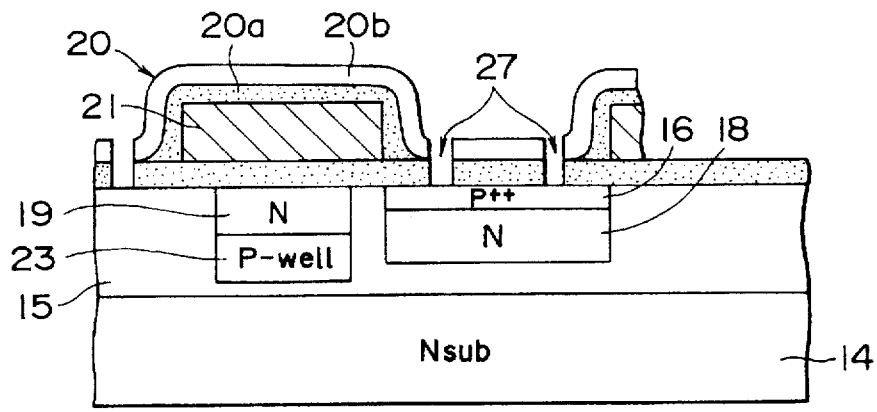
FIGS. 2A, 2B, and 2C are sectional views showing the steps of a forming method for a light shielding film.
Figure 2B:
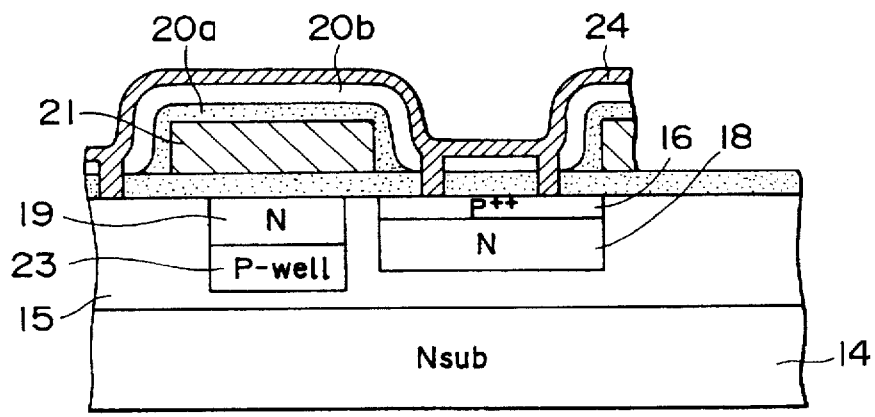
Figure 2C:
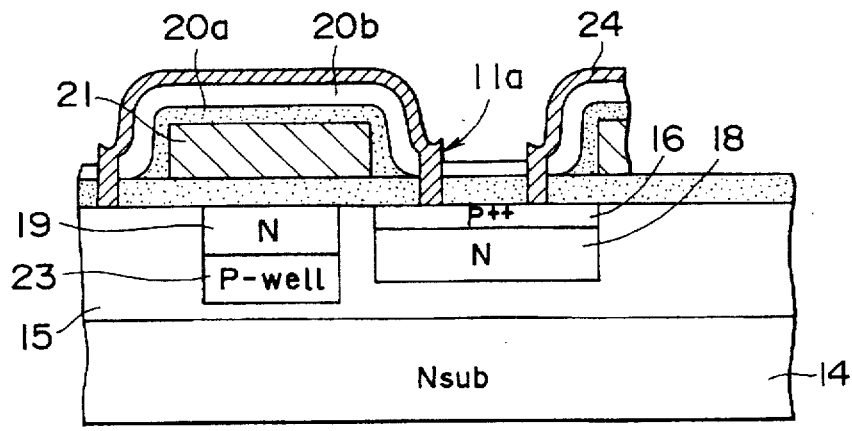

A method of forming the light shielding film 24 will now be described with reference to FIGS. 2A to 2C. As shown in FIG. 2A, prior to formation of the light shielding film 24, the insulating film 20 is patterned by photolithography and is then partially removed by dry etching to form grooves 27 reaching the silicon substrate 14 (step 1). The insulating film 20 is composed of a polysilicon oxide film 20a and a deposited oxide film 20b. Ion implantation of P-type impurity such as B or $BF_2$ may be sometimes carried out with low energy. Since the depth of each groove 27 is usually 200 nm or more, the ion implantation of B can be well carried out with a low energy of about 30 KeV or less by a self-alignment method without addition of a mask. Thereafter, as shown in FIG. 2B, the light shielding film 24 is formed by sputtering or the like (step 2). In this step, the grooves 27 previously formed in the insulating film 20 are filled with the material of the light shielding film 24. Thereafter, as shown in FIG. 2C, the light shielding film 24 is patterned by photolithography and etching to form the opening 11a of the sensor region 11, for allowing the incidence of external light upon the sensor region 11 (step 3).

In the CCD area sensor configured above, the light shielding film 24 over the sensor region 11 is in contact with the substrate 14. That is, the insulating film 20 is absent between the substrate 14 and the light shielding film 24 formed in the periphery of the opening 11a of the sensor region 11. Accordingly, even when a large quantity of light is incident on the sensor region 11, or light is obliquely incident on the sensor region 11, there is no possibility that the incident light may partially leak through between the light shielding film 24 and the substrate 14 into the signal charge transfer layer 19 of the vertical transfer register 13. Accordingly, it is possible to reduce the smear due to the leakage of incident light through between the substrate 14 and the light shielding film 24 formed in the periphery of the opening 11a of the sensor region 11 into the signal charge transfer layer 19.

Furthermore, the following effects can be obtained by providing the potential applying means 26 to apply a predetermined potential to the light shielding film 24. A specific embodiment of the application of the predetermined potential to the light shielding film 24 is to suitably adjust the potential to be applied to the light shielding film 24 and control the potential of the sensor interface. Accordingly, even when there is a potential difference due to a voltage drop or the like between the periphery and the interior of the sensor region 11, the potential of the sensor interface is not affected by the potential difference, but can be set equal to or lower than the quasi-Fermi level of the hole accumulation layer 16. The quasi-Fermi level of the hole accumulation layer 16 is about 0.5 V, for example, when the impurity concentration is sufficiently high (about $10^{20}/cm^3$). Accordingly, the application of a potential lower than the quasi-Fermi level of the hole accumulation layer 16 to the light shielding film 24 makes it possible to fill the interface state and provide a flat energy level of the hole accumulation layer 16, so that the generation of electrons from the interface state or an impurity level can be suppressed. As a result, the generation of a false signal in the sensor region 11 can be suppressed, and a white-spot defect caused by the false signal to appear on a reproduction screen can therefore be reduced.

Another specific embodiment of the application of the predetermined potential to the light shielding film 24 is to apply to the light shielding film 24 a potential lower than the surface potential of the sensor region 11 at which a Hall resistance decreases, when the sensor region 11 detects light.

Figure 3:
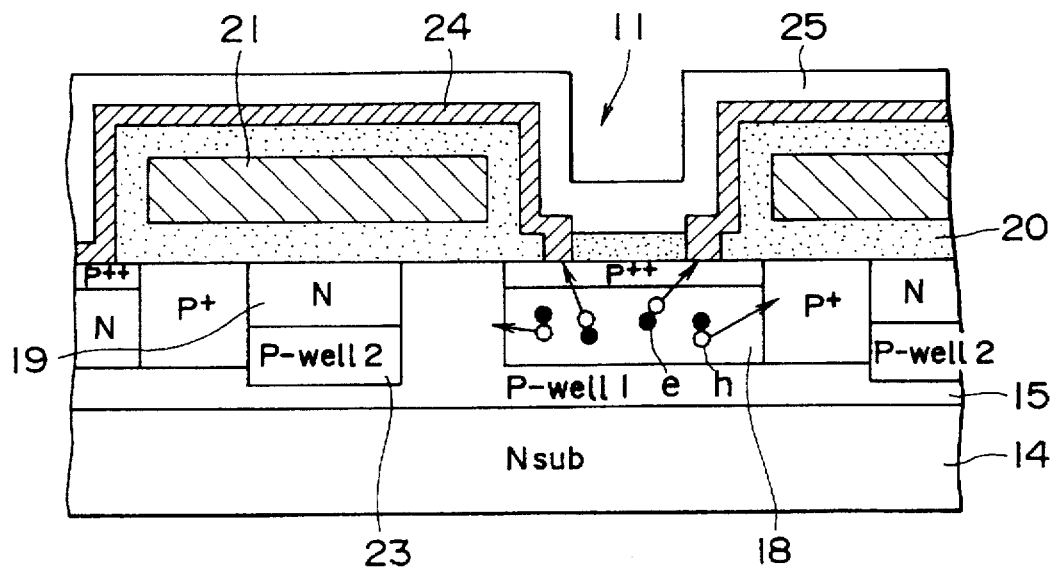
FIG. 3 is a conceptual sectional view illustrating the paths of minority carriers upon detection of light by a sensor region.

In this manner, the light shielding film 24 is let have a potential difference in a direction decreasing with respect to the surface potential of the sensor region 11, thereby forming a path along which minority carriers (holes h in FIG. 3) generated by photoelectric conversion are allowed to escape into the light shielding film 24 as shown in FIG. 3. Thus, the minority carriers escape through this path into the light shielding film 24. As a result, of pairs of electrons e and holes h generated by photo-electric conversion, ones that will soon be recombined to disappear can be reduced.

That is, the application of a potential lower than the surface potential of the sensor region 11 to the light shielding film 24 allows a reduction in probability of recombination of electrons e and holes h. Accordingly, sensitivity and S/N can be improved, and a dark current can be reduced, so that a noise level especially under a low illuminance can be reduced, and a so-called Qknee characteristic such that the accumulation amount in the sensor region 11 in the case where the quantity of incident light is greater than or equal to a saturated light quantity becomes near a constant value, can be improved, thus improving the photodetecting characteristics of the sensor region 11. In FIG. 3, the arrows show the traveling paths of holes.

Figure 4:
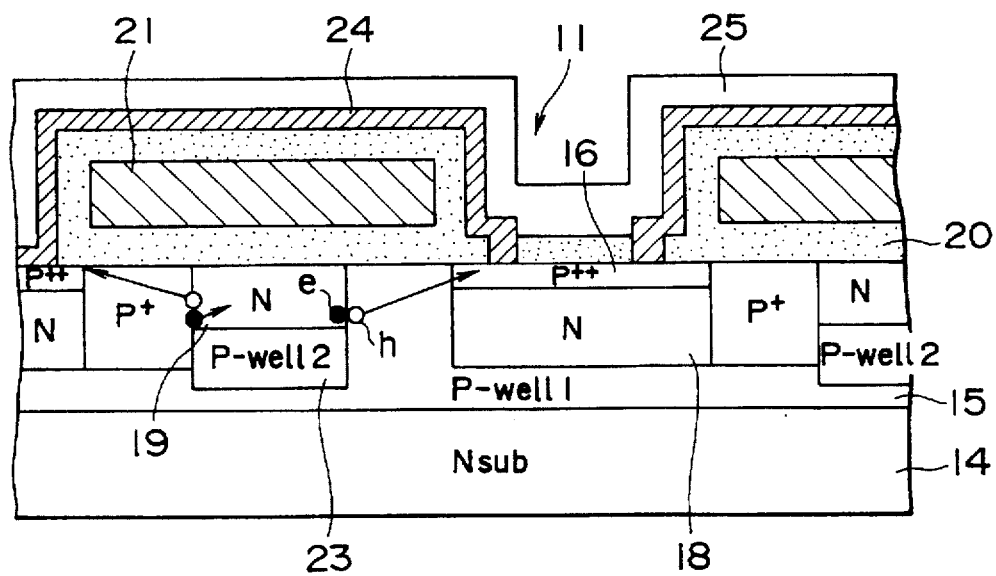
FIG. 4 is a conceptual sectional view illustrating the paths of minority carriers upon accumulation of charges by a vertical transfer register.

Further, the application of a potential lower than the potential of the signal charge transfer layer 19 at some moment to the light shielding film 24 upon vertical transfer by the vertical transfer register 13 makes it possible to fix the potentials of the read-out gate region 12 and the channel stop region 17 normally in a substantially floating condition to a GND level or lower, thus stabilizing the potential of the periphery of the vertical transfer register 13. Accordingly, as shown in FIG. 4, the escape of holes h as minority carriers can be facilitated to thereby reduce a dark current and improve the transfer efficiency. Furthermore, the amount of holes h to be accumulated in the second P-well 23, the channel stop region 17, and the first P-well 15 can be reduced to thereby reduce the amount of charges to be handled in the transfer region (the amount of charges to be accumulated in the transfer region).

Figure 5A:
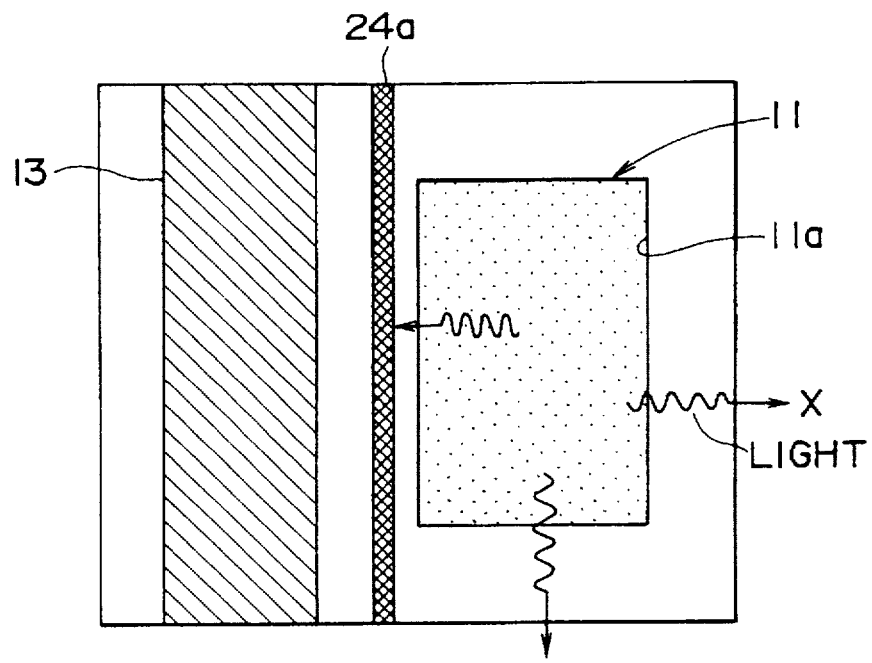
FIGS. 5A, 5B, 6A, and 6B are plan views illustrating various patterns of a contact portion of the light shielding film to a substrate.
Figure 5B:
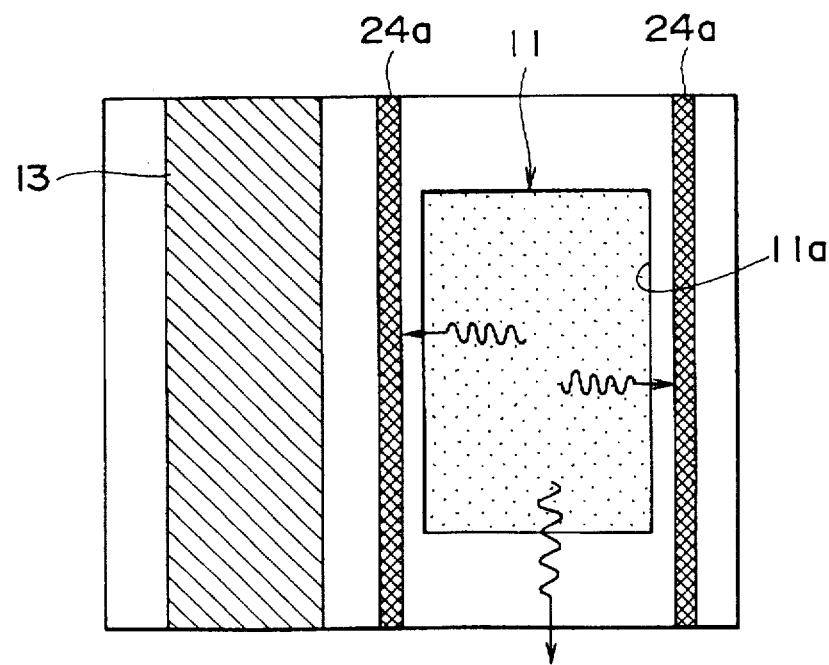

FIGS. 5A to 6B show plan views of various patterns of a contact portion of the light shielding film 24 to the substrate 14. The pattern shown in FIG. 5A is such that a contact portion 24a of the light shielding film 24 is formed on the vertical transfer register 13 side only so as to extend along its transfer direction. This pattern is intended primarily to stop the incidence of light from the opening 11a of the sensor region 11 to the vertical transfer register 13. In FIG. 5A, the mark X denotes the site where photo-electric conversion is performed. The pattern shown in FIG. 5B is such that two contact portions 24a of the light shielding film 24 are formed on opposite sides of the sensor region 11 so as to extend along the vertical transfer direction. This pattern is intended to stop the incidence of light from the opening 11a of the sensor region 11 to the vertical transfer registers 13 on the opposite sides of the sensor region 11.

Figure 6A:
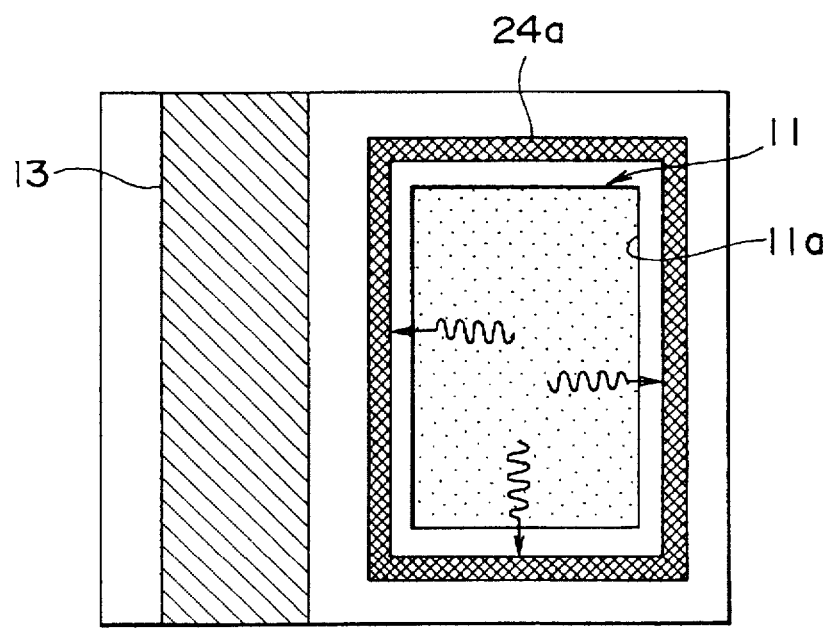
Figure 6B:
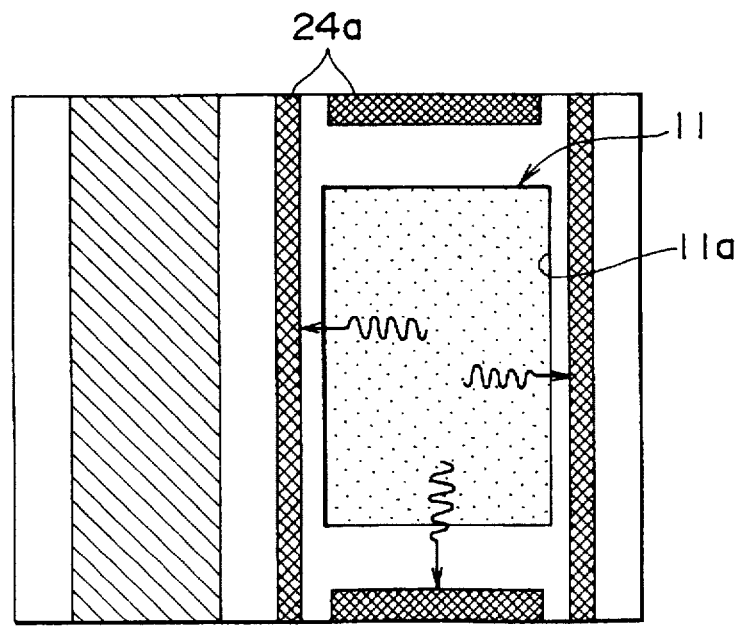

The pattern shown in FIG. 6A is such that a contact portion 24a of the light shielding film 24 is formed so as to completely surround the sensor region 11. This pattern is intended to stop the incidence of light from the opening 11a of the sensor region 11 to all paths. That is, this pattern is intended to stop the incidence of light not only to the opposite vertical transfer registers 13, but also to adjacent pixels arranged in the vertical direction. The pattern shown in FIG. 6B as similar to the pattern shown in FIG. 6A is such that a contact portion 24a of the light shielding film 24 is formed so as to almost fully surround the sensor region 11, intending to stop the incidence of light to all paths. However, this pattern is different from the pattern shown in FIG. 6A in that the looped contact portion 24a is partially opened. This partial opening of the looped contact portion 24a is due to the following reason. That is, a noise level can be reduced by depositing SiN by plasma CVD or the like after formation of the light shielding film 24, and injecting hydrogen by heat treatment at 300° C. or higher to thereby fill the interface state between the substrate 14 and the silicon oxide film, $SiO_2$. To open a path for this purpose, a part of the looped pattern having no influence upon smear is opened.

Figure 7:
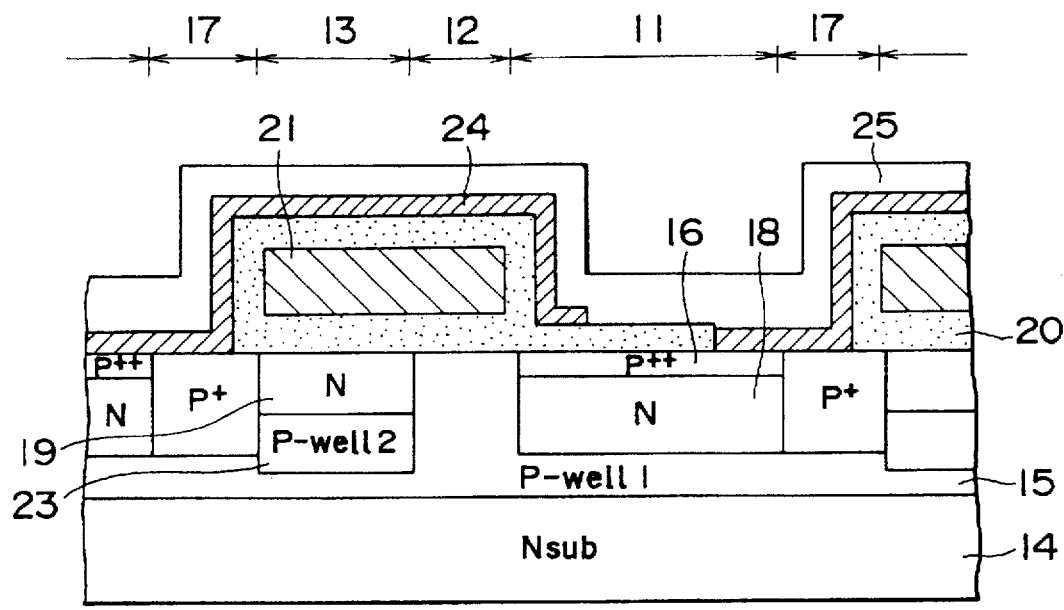
FIG. 7 is a sectional view of a sensor region and its peripheral region, showing another preferred embodiment of the present invention, corresponding to a cross section taken along the line X—X in FIG. 10.
Figure 8:
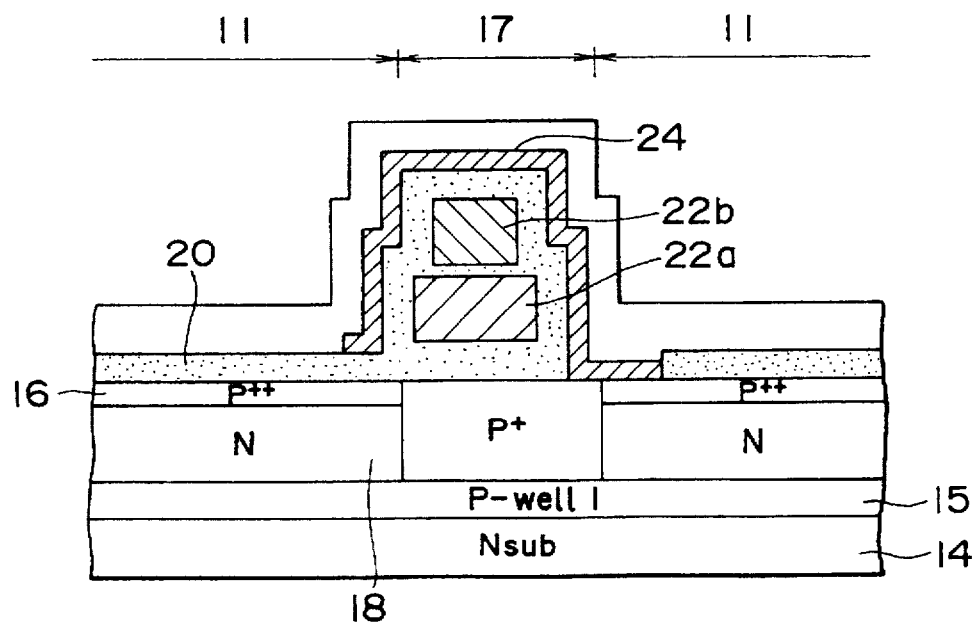
FIG. 8 is a sectional view of the sensor region and its peripheral region shown in FIG. 7, corresponding to a cross section taken along the line Y—Y in FIG. 10.

FIG. 7 is a sectional view of the structure showing another preferred embodiment of the present invention, which corresponds to the cross section taken along the line X—X shown in FIG. 10. FIG. 8 is a sectional view of this structure, which corresponding to the cross section taken along the line Y—Y shown in FIG. 10. In this preferred embodiment, the transfer electrode 21 of the vertical transfer register 13 is formed over only the read-out gate region 12 and the signal charge transfer layer 19 in the substrate 14, and the light shielding film 24 is in contact with the substrate 14 over the sensor region 11 and the channel stop region 17. In the previous preferred embodiment shown in FIG. 1, the contact between the light shielding film 24 over the sensor region 11 and the substrate 14 has been made in the periphery of the opening 11a of the sensor region 11. In contrast, in this preferred embodiment shown in FIGS. 7 and 8, the contact between the light shielding film 24 and the substrate 14 is made on one side of the sensor region 11 in the X-direction as shown in FIG. 7, and on one side of the sensor region 11 in the Y-direction as shown in FIG. 8.

According to this preferred embodiment as mentioned above, the transfer electrode 21 of the vertical transfer register 13 is formed over only the read-out gate region 12 and the signal charge transfer layer 19, that is, the width of the transfer electrode 21 in the X-direction is made smaller than that of the previous preferred embodiment shown in FIG. 1, thereby widening a contact region of the light shielding film 24 to the substrate 14. Thus, the contact between the light shielding film 24 and the substrate 14 can be easily made. Further, since the contact between the light shielding film 24 and the substrate 14 is made not only on the sensor region 11, but also on the channel stop region 17, the potentials of the channel stop region 17 and the sensor interface can be controlled by adjusting the potential of the light shielding film 24. Accordingly, the generation of a false signal in the sensor region 11 can be suppressed by setting the potentials of the channel stop region 17 and the sensor interface to the quasi-Fermi level or lower, thereby reducing a white-spot defect appearing on a reproduction screen because of this false signal.

Figure 12:
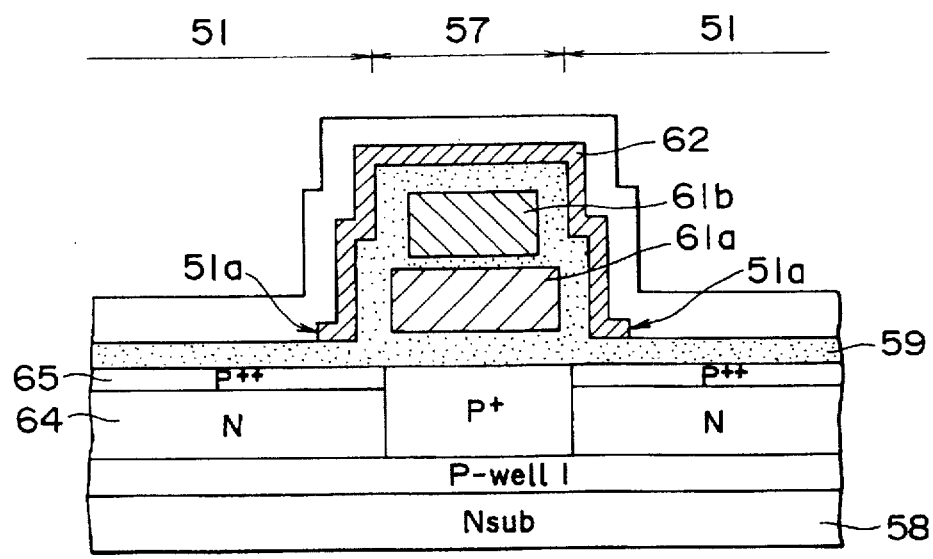
FIG. 12 is a cross section taken along the line Y—Y in FIG. 10.
Figure 13:
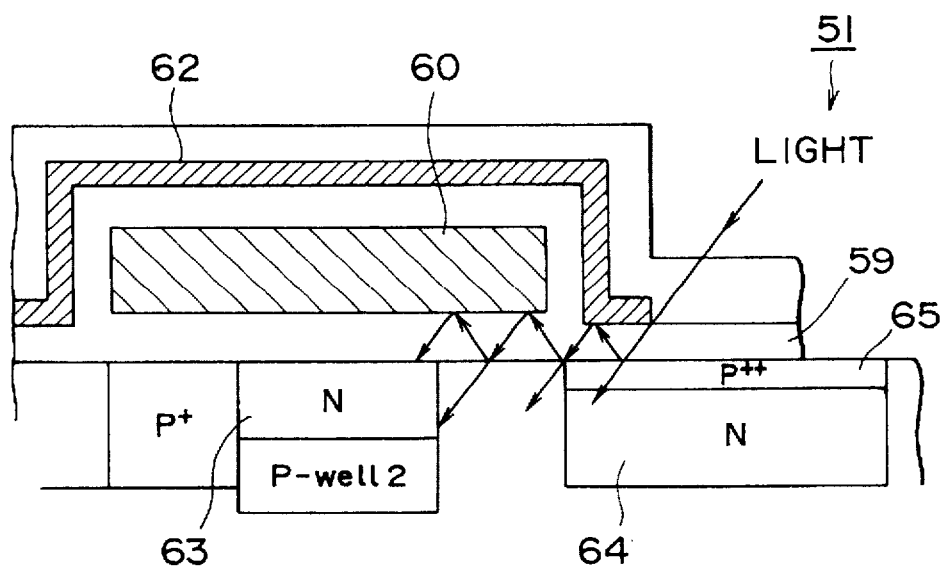
FIG. 13 is an enlarged sectional view of an essential part shown in FIG. 11, illustrating a condition where incident light falling on a sensor region leaks into a vertical transfer register.

In the vertical transfer register 13, the transfer electrode 21 extending in the charge transfer direction (Y-direction) has a two-layer structure formed by polysilicon. As shown in FIG. 8, wiring patterns 22a and 22b for connecting the lower layers of the adjacent vertical transfer registers 13 and the upper layers of the adjacent vertical transfer registers 13, respectively, are formed over the channel stop region 17 between the adjacent pixels (the adjacent sensor regions 11) in the charge transfer direction. In this preferred embodiment, the widths of the wiring patterns 22a and 22b in the Y-direction are smaller than those in the conventional structure shown in FIG. 12. That is, the wiring patterns 22a and 22b are reduced in width on their one side in the Y-direction, thereby allowing the contact between the light shielding film 24 and the substrate 14 also in the Y-direction. Furthermore, since the widths of the wiring patterns 22a and 22b are reduced, a contact region of the light shielding film 24 to the substrate 14 can be widened to thereby easily make the contact.

Figure 9:
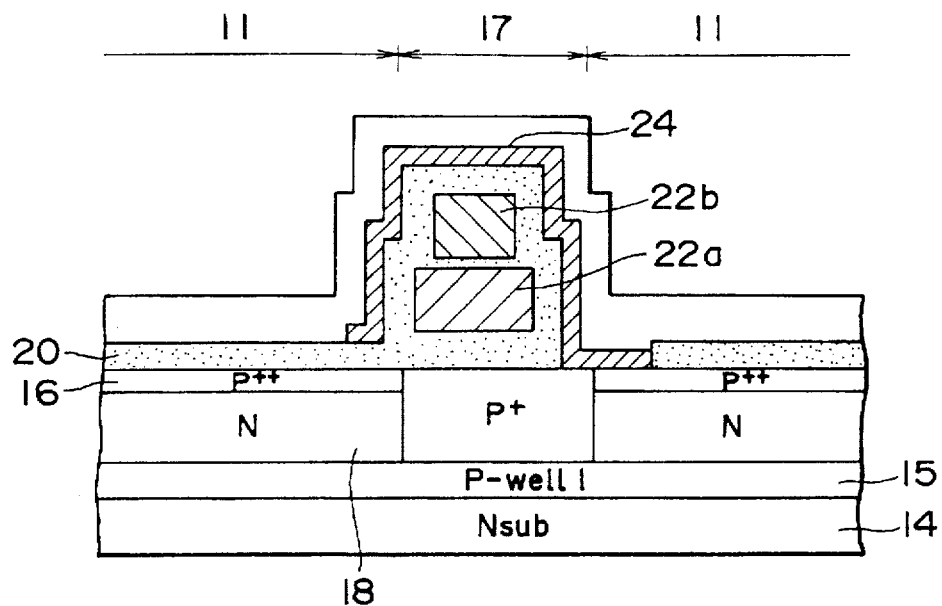
FIG. 9 is a sectional view of a sensor region and its peripheral region, showing a modification of the structure shown in FIG. 8, corresponding to a cross section taken along the line Y—Y in FIG. 10.

While the preferred embodiment shown in FIG. 8 has the structure that the contact between the light shielding film 24 and the substrate 14 is made on one side of the wiring patterns 22a and 22b in the Y-direction, the contact may be made on both sides of the wiring patterns 22a and 22b in the Y-direction as shown in FIG. 9.

According to the solid-state image sensing device of the present invention as described above, the light shielding film is in contact with the substrate over the sensor region, and a predetermined potential is applied to the light shielding film. With this structure, no insulating film is present between the substrate and the light shielding film in the periphery of the opening of the sensor region, so that a part of incident light falling on the sensor region is prevented from leaking through between the light shielding film and the substrate into the charge transfer region. Therefore, it is possible to reduce the smear due to the leakage of the incident light through between the substrate and the light shielding film in the periphery of the opening of the sensor region into the charge transfer region. Furthermore, the potential of the light shielding film is suitably set to a desired potential, thereby allowing a reduction in smear, an improvement in photodetecting characteristics such as sensitivity and S/N of the sensor region, and an improvement in charge accumulation characteristics and transfer characteristics of the vertical transfer register.

While the invention has been described with reference to specific embodiments, the description is illustrative and is not to be construed as limiting the scope of the invention. Various modifications and changes may occur to those skilled in the art without departing from the spirit and scope of the invention as defined by the appended claims.

What is claimed is:

1. A solid-state image sensing device comprising:

a sensor region composed of a plurality of photosensor;

a charge transfer region for transferring a signal charge read out from said sensor region through a read-out gate region;

an isolation region provided opposite to at least said read-out gate region with respect to said sensor region;

a substrate in which said sensor region, said charge transfer region, and said isolation region are formed;

a transfer electrode formed over at least said charge transfer region and said read-out gate region through an insulating film;

a light shielding film provided outside said transfer electrode and on at least one edge of said sensor region to prevent incidence of external light upon said charge transfer region, said light shielding film also provided on part of said isolation region, said light shielding film being in contact with said substrate over said sensor region and said isolation region such that a potential of an interface between the sensor region and the light shielding film can be controlled by adjusting a predetermined potential of the light shielding film; and means for applying said predetermined potential to said light shielding film, said predetermined potential being a potential lower than a surface potential of said sensor region.

2. A solid-state image sensing device comprising:

a sensor region composed of a plurality of photosensor, said sensor region comprising a first conductive type of semiconductor layer and a second conductive type of semiconductor layer provided on a surface of said first conductive type of semiconductor layer;

an isolation region provided opposite to at least said read-out gate region with respect to said sensor region;

a substrate in which said sensor region, said charge transfer region, and said isolation region are formed;

a transfer electrode formed over at least said charge transfer region and said read-out gate region through an insulating film;

a light shielding film provided outside said transfer electrode and on at least one edge of said sensor region to prevent incidence of external light upon said charge transfer region, said light shielding film also provided on part of said isolation region, said light shielding film being in contact with said substrate over said sensor region and said isolation region such that a potential of an interface between the sensor region and the light shielding can be controlled by adjusting a predetermined potential of the light shielding film; and means for applying said predetermined potential to said light shielding film, said predetermined potential being a potential for making a potential of an interface of said sensor region equal to or lower than a quasi-Fermi level of said second conductive type of semiconductor layer, said predetermined potential being a potential lower than a surface potential of said sensor region.

3. A solid-state image sensing device according to either claim 1 or 2, wherein said predetermined potential is applied when said sensor region detects light.

4. A solid-state image sensing device according to either claim 1 or 2, wherein said sensor region is a linear sensor having a one-directional arrangement of said photosensors.

5. A solid-state image sensing device according to either claim 1 or 2, wherein said sensor region is an area sensor having a two-dimensional arrangement of said photosensors.

6. A solid-state image sensing device according to claim 3, wherein said sensor region is a linear sensor having a one-directional arrangement of said photosensors.

7. A solid-state image sensing device according to claim 3, wherein said sensor region is an area sensor having a two-dimensional arrangement of said photosensors.

8. A solid-state image sensing device comprising:

a plurality of sensor regions, each composed of a photosensor;

a plurality of respective charge transfer regions for transferring respective signal charges from said sensor regions through respective read-out gate regions;

a plurality of respective isolation regions provided opposite at least said read-out gate regions with respect to said sensor regions;

a substrate in which said sensor region, said charge transfer regions, and said isolation regions are formed;

respective transfer electrodes respectively formed over at least said charge transfer regions and said read-out gate regions through an insulating film;

a light shielding film provided outside said transfer electrodes and on at least one edge of said sensor regions to prevent incidence of external light upon said charge transfer regions, said light shielding film also provided on part of said isolation region, said light shielding film being in contact with said substrate over said sensor regions and said isolation regions such that an interface between the sensor region and the light shielding film can be controlled by adjusting a predetermined potential of the light shielding film; and means for applying said predetermined potential to said light shielding film, said predetermined potential being a potential lower than a surface potential of said sensor region.

* * * * *